United States Patent
Yoon et al.

(10) Patent No.: US 7,847,291 B2
(45) Date of Patent: Dec. 7, 2010

(54) DISPLAY SUBSTRATE

(75) Inventors: Kap-Soo Yoon, Seoul (KR); Sung-Hoon Yang, Seoul (KR); Sung-Ryul Kim, Cheonan-si (KR); O-Sung Seo, Seoul (KR); Hwa-Yeul Oh, Seoul (KR); Jae-Ho Choi, Seoul (KR); Seong-Hun Kim, Seoul (KR); Yong-Mo Choi, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/486,328

(22) Filed: Jun. 17, 2009

(65) Prior Publication Data

US 2010/0006835 A1    Jan. 14, 2010

(30) Foreign Application Priority Data

Jul. 14, 2008    (KR) .................... 10-2008-0068242

(51) Int. Cl.
    *H01L 29/04*    (2006.01)
(52) U.S. Cl. ........................... 257/59; 257/72; 257/366
(58) Field of Classification Search .................... 257/59, 257/72, 365, 366, 43
    See application file for complete search history.

(56) References Cited

U.S. PATENT DOCUMENTS 5,831,707 A * 11/1998 Ota et al. .................... 349/141

* cited by examiner

*Primary Examiner*—Mark Prenty
(74) *Attorney, Agent, or Firm*—Cantor Colburn LLP (57) ABSTRACT

A display substrate includes; a substrate, a gate electrode arranged on the substrate, a semiconductor pattern arranged on the gate electrode, a source electrode arranged on the semiconductor pattern, a drain electrode arranged on the semiconductor pattern and spaced apart from the source electrode, an insulating layer arranged on, and substantially covering, the source electrode and the drain electrode to cover the source electrode and the drain electrode, a conductive layer pattern arranged on the insulating layer and overlapped aligned with the semiconductor pattern, a pixel electrode electrically connected to the drain electrode, and a storage electrode arranged on the substrate and overlapped overlapping with the pixel electrode, the storage electrode being electrically connected to the conductive layer pattern.

23 Claims, 6 Drawing Sheets

DISPLAY SUBSTRATE

This application relies priority to Korean Patent Application No. 2008-68242, filed on Jul. 14, 2008, and all the benefits accruing therefrom under 35 U.S.C. §119, the contents of which in its entirety are herein incorporated by reference.

BACKGROUND OF THE INVENTION

1. Field of the Invention

The present invention relates to a display substrate having a thin film transistor ("TFT").

2. Description of the Related Art

A display substrate that serves as an array substrate for a display apparatus, in general, includes a substrate, a plurality of thin film transistors ("TFTs") arranged on the substrate, and a plurality of pixel electrodes electrically connected to the TFTs in one-to-one correspondence.

In order to switch a data signal applied to the pixel electrodes, the TFTs include a semiconductor material that serves as a conductor under certain conditions. Silicon material has been widely used as the semiconductor material. In addition, an organic semiconductor material and an oxide semiconductor material have also been used as the semiconductor material.

In general, the oxide semiconductor material has a superior electrical mobility, thereby improving switching characteristics of the TFT. However, the switching characteristics of the TFT are changed according to the mixture ratio of each element in the oxide semiconductor material.

BRIEF SUMMARY OF THE INVENTION

An exemplary embodiment of the present invention provides a display substrate having a thin film transistor ("TFT") of which a threshold voltage is easily controlled.

In an exemplary embodiment of the present invention, a display substrate includes; a substrate, a gate electrode arranged on the substrate, a semiconductor pattern arranged on the gate electrode, a source electrode arranged on the semiconductor pattern, a drain electrode arranged on the semiconductor pattern and spaced apart from the source electrode, an insulating layer arranged on, and substantially covering, the source electrode and the drain electrode, a conductive layer pattern arranged on the insulating layer and aligned with the semiconductor pattern, a pixel electrode electrically connected to the drain electrode, and a storage electrode arranged on the substrate and overlapping the pixel electrode, the storage electrode being electrically connected to the conductive layer pattern.

In one exemplary embodiment, in a TFT that is defined by the gate electrode, the source electrode, the drain electrode, and the semiconductor pattern, the conductive layer pattern is aligned with the semiconductor pattern while interposing the insulating layer therebetween, so that the conductive layer pattern may serve as a top-gate electrode of the TFT. Therefore, a threshold voltage of the TFT may be adjusted according to a voltage level of a common voltage applied to the conductive layer pattern.

In another exemplary embodiment of the present invention, a display substrate includes; a substrate, a conductive layer pattern arranged on the substrate and which receives a first common voltage, a first insulating layer arranged on the conductive layer pattern and which substantially covers the conductive layer pattern, a source electrode arranged on the first insulating layer and aligned with the conductive layer pattern, a drain electrode arranged on the first insulating layer and spaced apart from the source electrode and aligned with the conductive layer pattern, a semiconductor pattern arranged on the source electrode and the drain electrode, a second insulating layer arranged on the semiconductor pattern, and a gate electrode arranged on the second insulating layer and aligned with the semiconductor pattern.

In a TFT that is defined by the gate electrode, the source electrode, the drain electrode, and the semiconductor pattern, the conductive layer pattern is aligned with the semiconductor pattern while interposing the first insulating layer therebetween, and thus the conductive layer pattern may serve as a bottom-gate electrode of the TFT. Therefore, a threshold voltage of the TFT may be adjusted according to a voltage level of a first common voltage applied to the conductive layer pattern.

In another exemplary embodiment of the present invention, a display substrate includes; a substrate, a gate electrode arranged on the substrate, a semiconductor pattern arranged on the gate electrode, a source electrode arranged on the semiconductor pattern, a drain electrode arranged on the semiconductor pattern and spaced apart from the source electrode, an insulating layer arranged on the source electrode and the drain electrode, and which substantially covers the source electrode and the drain electrode, and a conductive layer pattern arranged on the insulating layer, and overlapping the semiconductor pattern, and electrically connected to the gate electrode.

According to the above, even though the threshold voltage of the TFT varies according to the semiconductor material, the threshold voltage of the TFT may be easily controlled by adjusting the voltage level of the common voltage applied to the conductive layer pattern.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1:
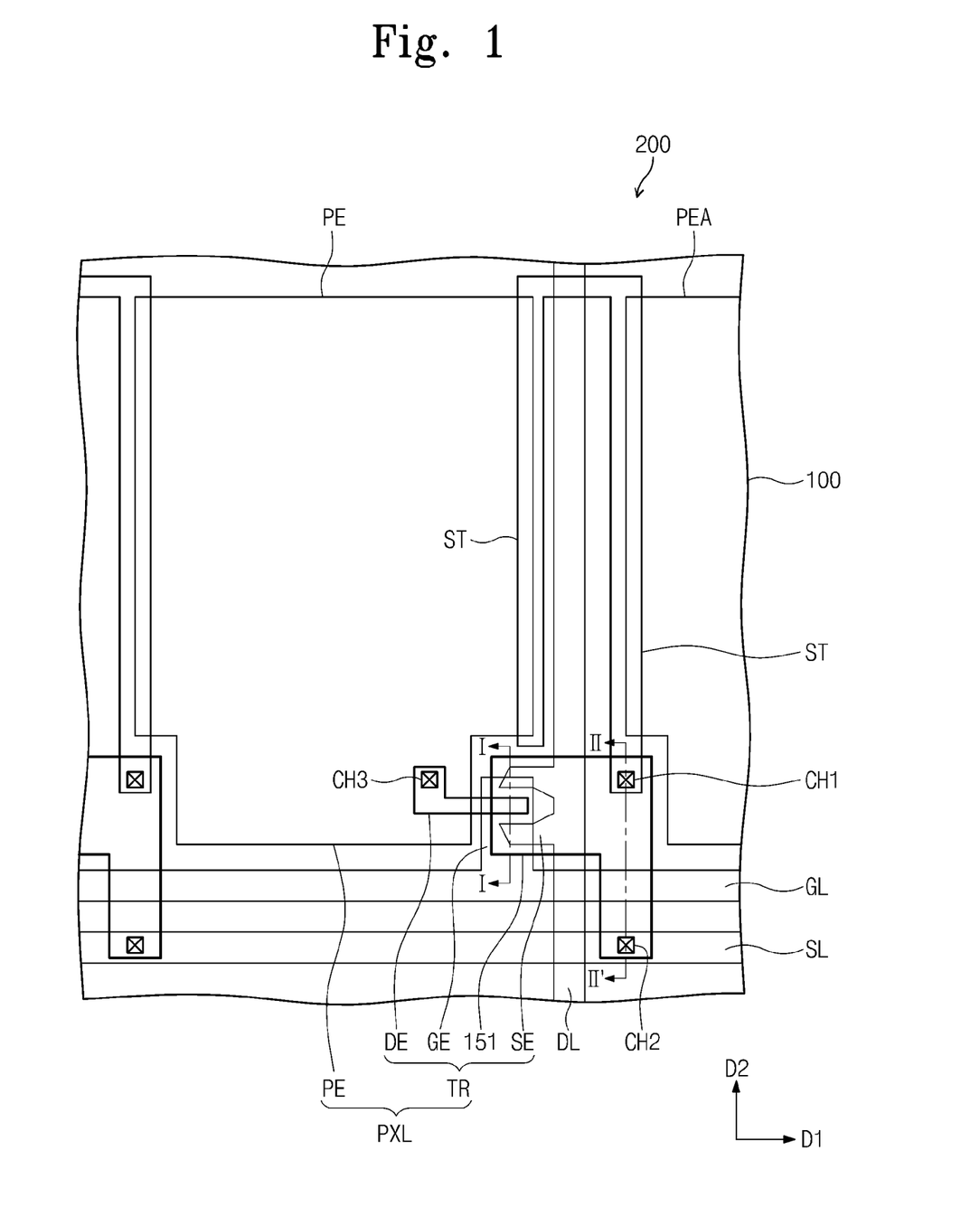
FIG. 1 is a top plan layout view illustrating an exemplary embodiment of a display substrate according to the present invention.
Figure 2:
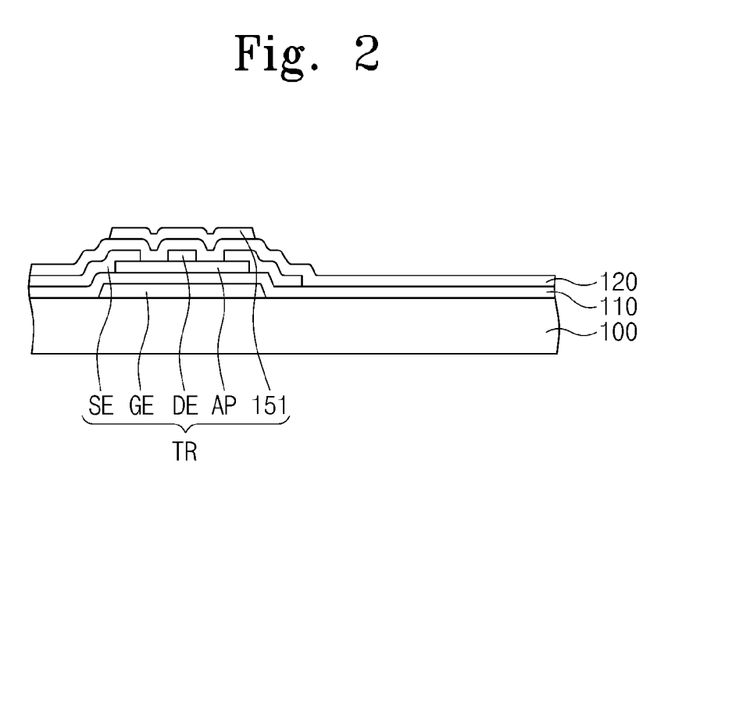
FIG. 2 is a cross-sectional view taken along line I-I' of FIG. 1.
Figure 3:
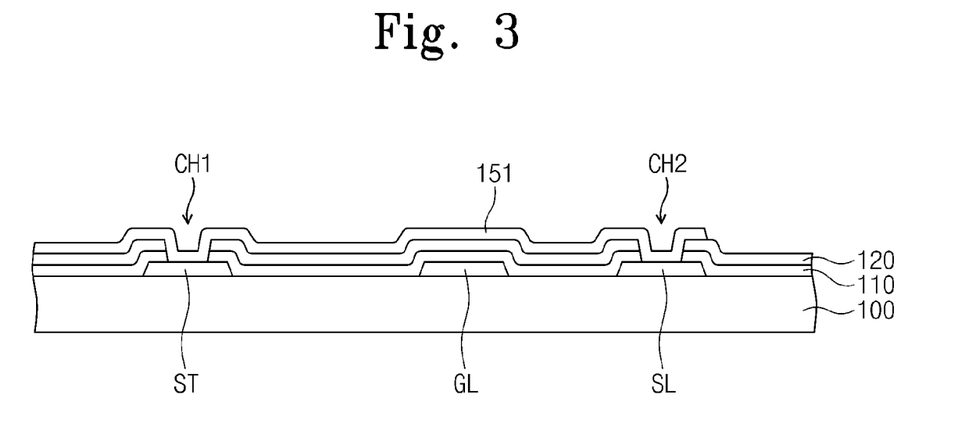
FIG. 3 is a cross-sectional view taken along line II-II' of FIG. 1.

FIG. 1 is a top plan layout view illustrating an exemplary embodiment of a display substrate according to the present invention, FIG. 2 is a cross-sectional view taken along line I-I' of FIG. 1, and FIG. 3 is a cross-sectional view taken along line II-II' of FIG. 1. In FIGS. 1 to 3, a display substrate 200 that serves as an array substrate applied to a display apparatus such as a liquid crystal display is illustrated.

Referring to FIGS. 1 to 3, the display substrate 200 includes a substrate 100, a gate line GL, a data line DL, a storage line SL, a storage electrode ST, and a pixel PXL. The pixel PXL includes a thin film transistor ("TFT") TR and a pixel electrode PE that is electrically connected to the TFT TR. Meanwhile, the display substrate 200 includes a plurality of pixels, and in the present exemplary embodiment the pixels have substantially the same structure and function. Thus, only one pixel PXL will be described in detail in FIG. 1 and the detailed description of the other pixels will be omitted.

The gate line GL extends substantially in a first direction D1 and is arranged on the substrate 100, and the gate line GL transmits a gate signal, which turns on the TFT TR. In the present exemplary embodiment, the data line DL is arranged in a layer above the gate line GL, with a first insulating layer 110 interposed therebetween. In the present exemplary embodiment, the first insulating layer 110 includes an insulating material, exemplary embodiments of which include silicon oxide ("SiOx"), silicon nitride ("SiNx") and other materials having similar characteristics. The data line DL transmits a data signal that is applied to the pixel electrode PE. The data line DL extends in a second direction D2, which is substantially perpendicular to the first direction D1 and crosses, but does not intersect, the gate line GL.

The storage line SL extends in the first direction D1 and is spaced apart from the gate line GL. The storage line SL is configured to transmit a common voltage therealong. In one exemplary embodiment, the storage line SL and the gate line GL may include a substantially similar material. In an exemplary embodiment that the storage line SL includes the same material as the gate line GL, the storage line SL may be substantially simultaneously formed with the gate line GL through one photolithography process, thereby reducing manufacturing steps and also manufacturing costs.

The storage electrode ST includes a first branch which extends in the second direction D2, a stem portion which extends in the first direction D1, and a second branch which extends in the second direction D2 so that the storage electrode ST makes a U-shape. The storage electrode ST is electrically connected to the storage line SL by a conductive layer pattern 151. The storage electrode ST overlaps the data line DL, the pixel electrode PE, and another pixel electrode PEA adjacent to the pixel electrode PE shown in the top plan layout view of FIG. 1, while interposing the data line DL therebetween, thereby forming a storage capacitor. In the exemplary embodiment wherein the display substrate 200 is used as an array substrate for a liquid crystal display ("LCD"), the storage capacitor serves to uniformly maintain a data signal applied to the pixel electrode PE.

The conductive layer pattern 151 is electrically connected to the storage electrode ST through a first contact hole CH1, and the conductive layer pattern 151 is electrically connected to the storage line SL through a second contact hole CH2. Thus, the common voltage transmitted through the storage line SL is applied to the storage electrode ST, so that the common voltage may be used to form the storage capacitor.

The TFT TR includes a gate electrode GE, a drain electrode DE, a source electrode SE, a semiconductor pattern AP, and the conductive layer pattern 151. The TFT TR is turned on in response to a gate signal applied through the gate line GL to allow a data signal, which is transmitted to through the data line DL, to be applied to the pixel electrode PE.

The gate electrode GE branches from the gate line GL and is arranged on the substrate 100. The semiconductor pattern AP is arranged on the first insulating layer 110 and overlaps the gate electrode GE. In one exemplary embodiment, the semiconductor pattern AP includes an oxide semiconductor, exemplary embodiments of which include GaInZnO ("GIZO"), MgAlOx, MgZnOx, and ZnO.

The source electrode SE branches from the data line DL and is arranged on the semiconductor pattern AP. Also, the source electrode SE is spaced apart from the drain electrode DE and arranged on the semiconductor pattern AP. In the present exemplary embodiment, the source electrode SE forms a C-shape substantially surrounding the drain electrode DE on three-sides. A second insulating layer 120 including an insulating material, exemplary embodiments of which include silicon oxide, is formed on the first insulating layer 110 to cover the source electrode SE and the drain electrode DE.

As described above, the conductive layer pattern 151 electrically connects the storage line SL and the storage electrode ST and is arranged on the second insulating layer 120 and overlaps the semiconductor pattern AP, so that the conductive layer pattern 151 may serve as a top-gate electrode of the TFT TR. Thus, the TFT TR may be formed as a dual-gate type TFT of which the gate electrode GE serves as a bottom-gate electrode and the conductive layer pattern 151 serves as a top-gate electrode.

Since the conductive layer pattern 151 is electrically connected to the storage line SL, the conductive layer pattern 151 may receive the common voltage transmitted through the storage line SL. As a result, a voltage level of the threshold voltage of the TFT TR varies according to a voltage level of the common voltage.

TABLE 1

| Common voltage (V) | Threshold voltage of the TFT TR (V) |
|---|---|
| −10 V | 23 V |
| −5 V | 14 V |
| 0 V | 4.8 V |
| 5 V | −4 V |
| 10 V | −12 V |
| 15 V | −18 V |
| 20 V | −21 V |

As shown in Table 1, assuming that a level of voltage applied to the gate electrode GE is uniformly maintained, the voltage level of the threshold voltage of the TFT TR varies according to variation of the voltage level of the common voltage. More particularly, as the voltage level of the common voltage applied to the conductive layer pattern 151 increases from −10 V to 20 V, the voltage level of threshold voltage of the TFT TR decreases from 23 V to −21 V.

In general, when the TFT includes an active pattern composed of the oxide semiconductor and one gate electrode, the voltage level of the threshold voltage of the TFT may vary over time due to the material properties of the oxide semiconductor. However, as describe above, since the voltage level of the threshold voltage of the TFT may be adjusted according to the variation of the voltage level of the common voltage applied to the conductive layer pattern 151, the voltage level of the threshold voltage affected from the oxide semiconductor may be easily controlled.

TABLE 2

| Driving time (sec.) | variation of threshold voltage (common voltage is 5 V) | variation of threshold voltage (common voltage is −5 V) | variation of threshold voltage (common voltage is −10 V) |
|---|---|---|---|
| 0 | 0 V | 0 V | 0 V |
| 100 | −1.1 V | −0.6 V | 0.02 V |
| 300 | −2 V | −0.8 V | 0.09 V |
| 1000 | −6.8 V | −1.7 V | −0.26 V |
| 3600 | −16 V | −4.4 V | −0.26 V |

Table 2 represents the variation of a threshold voltage of the TFT TR according to the driving time when the common voltages applied to the conductive layer pattern 151 are 5 V, −5 V, and −10 V, respectively, and the level of voltage applied to the gate electrode GE is uniformly maintained at −20 V.

Referring to Table 2, when the common voltage applied to the conductive layer pattern 151 is 5 V, the threshold voltage varies within a range of 0 V to −16 V as the driving time increases. Also, when the common voltage applied to the conductive layer pattern 151 is −5 V, the threshold voltage varies within a range of 0 V to −4.4 V as the driving time increases. In addition, when the common voltage applied to the conductive layer pattern 151 is −10 V, the threshold voltage varies within a range of 0 V to −0.26 V as the driving time increases. As shown in Table 2, the variation of the threshold voltage when the common voltage applied is −10 V is smaller than the variation of the threshold voltage when the common voltages applied are −5 V or 5 V.

In general, when a TFT includes one gate electrode and an active pattern composed of an oxide semiconductor and a negative gate voltage is applied to the gate electrode, a voltage level of a threshold voltage of the TFT may be continuously decreased as the driving time increases. However, as described above with reference to FIGS. 1 to 3, the voltage level variation of the threshold voltage of the TFT TR may be adjusted by controlling the voltage level of the common voltage applied to the conductive layer pattern 151.

Meanwhile, the pixel electrode PE is electrically connected to the drain electrode DE through a third contact hole CH3. The pixel electrode PE may include substantially the same material as the conductive layer pattern 151, and may be formed on substantially the same layer of the display as the conductive layer pattern 151. In the exemplary embodiment wherein the pixel electrode PE includes substantially the same material as the conductive layer pattern 151, the pixel electrode PE may be substantially simultaneously formed with the conductive layer pattern 151 by applying one photolithography process to a transparent conductive material such as indium tin oxide ("ITO") or indium zinc oxide ("IZO").

Figure 4:
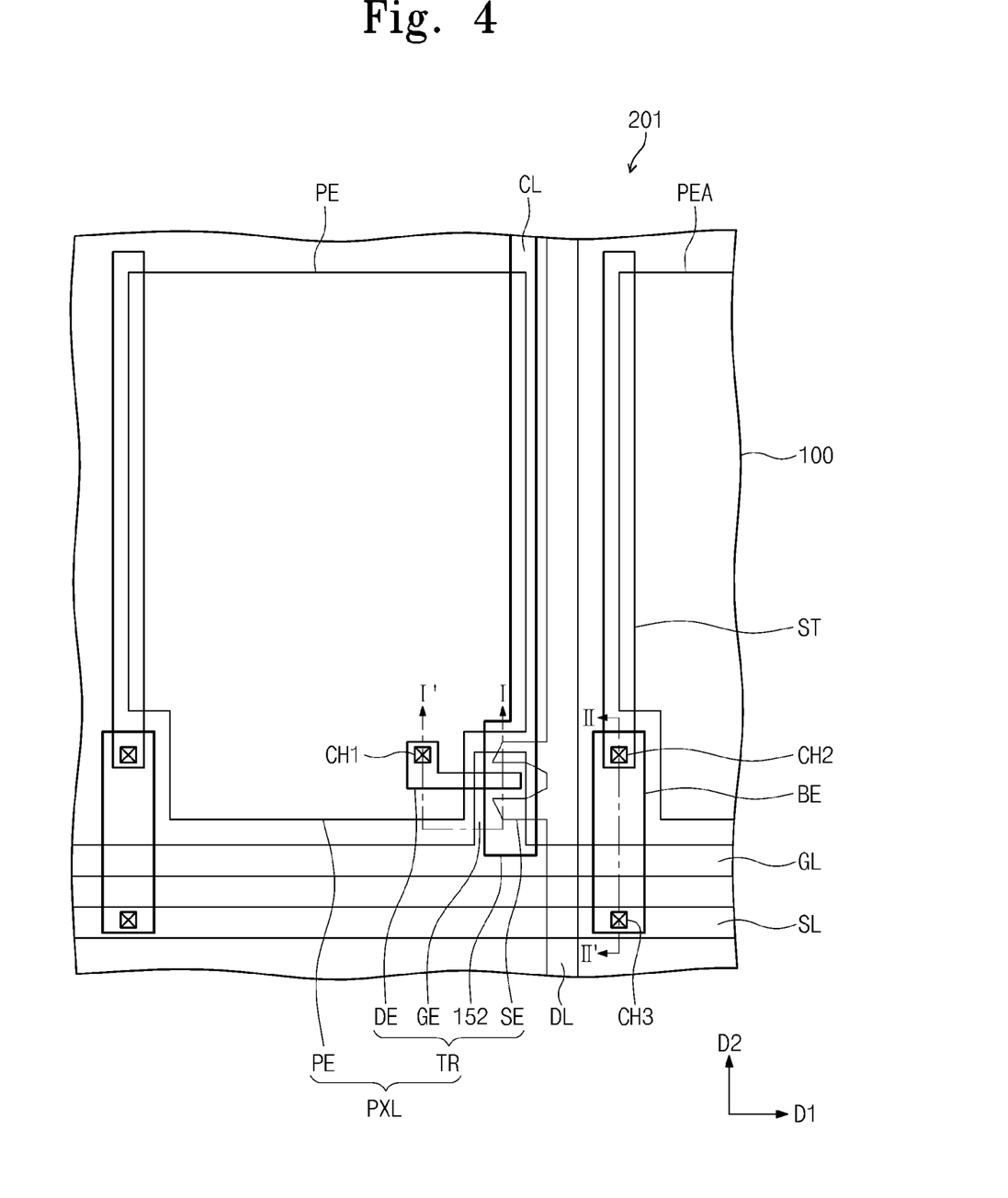
FIG. 4 is a top plan layout view illustrating another exemplary embodiment of a display substrate according to the present invention.
Figure 5:
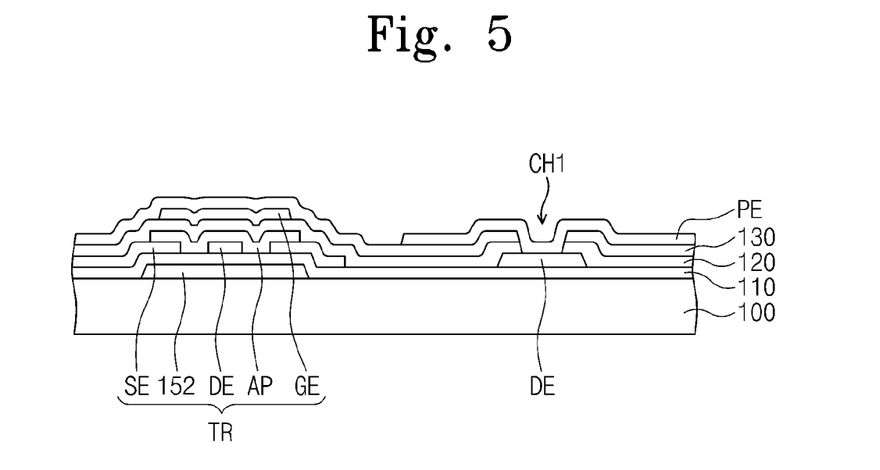
FIG. 5 is a cross-sectional view taken along line I-I' of FIG. 4.
Figure 6:
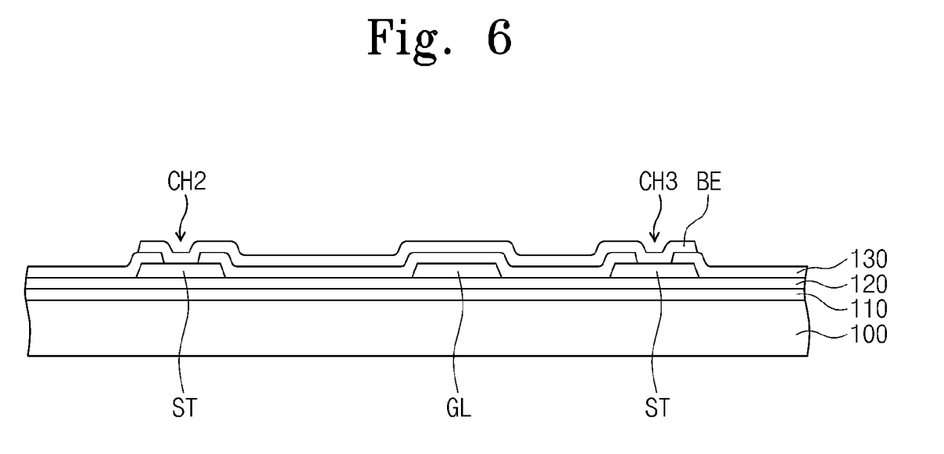
FIG. 6 is a cross-sectional view taken along line II-II' of FIG. 4.

FIG. 4 is a top plan layout view illustrating another exemplary embodiment of a display substrate according to the present invention, FIG. 5 is a cross-sectional view taken along line I-I' of FIG. 4, and FIG. 6 is a cross-sectional view taken along line II-II' of FIG. 4. In FIGS. 4 to 6, the same reference numerals denote the same elements in FIGS. 1 to 3, and thus the detailed descriptions of the same elements will be omitted.

Referring to FIGS. 4 to 6, a display substrate 201 includes a substrate 100, a gate line GL, a data line DL, a storage line SL, a storage electrode ST, a common voltage line CL, a conductive layer pattern 152, a connection electrode BE, and a pixel PXL. The pixel PXL includes a TFT TR and a pixel electrode PE, which is electrically connected to the TFT TR.

The common voltage line CL extends in a second direction D2. Also, the common voltage line CL transmits a first common voltage. The storage line SL extends in a first direction D1 that is substantially perpendicular to the second direction D2 to transmit a second common voltage separately controlled from the first common voltage, and the storage line SL is spaced apart from the gate line GL. In addition, the storage electrode ST extends in the second direction D2 and is electrically connected to the storage line SL by the connection electrode BE. Thus, the storage electrode ST receives the second common voltage from the storage line SL and forms a storage capacitor with the pixel electrode PE.

The connection electrode BE is electrically connected to the storage electrode ST through a second contact hole CH2 and electrically connected to the storage line SL through a third contact hole CH3. In one exemplary embodiment, the connection electrode BE may include substantially the same material as the pixel electrode PE. In such an exemplary embodiment, the connection electrode BE may be formed substantially simultaneously together with the pixel electrode PE through one photolithography process that patterns a transparent conductive material, exemplary embodiments of which include ITO and IZO.

The TFT TR includes the conductive layer pattern 152, a source electrode SE, a drain electrode DE, a semiconductor pattern AP, and a gate electrode GE. The TFT TR is turned on upon receiving a gate signal from the gate line GL to transmit a data signal to the pixel electrode PE via the data line DL.

The conductive layer pattern 152 is branched from the common voltage line CL and arranged on the substrate 100. In the present exemplary embodiment, the conductive layer pattern 152 forms an area at the end of the common voltage line CL having an increased surface area. A first insulating layer 110 is arranged on the conductive layer pattern 152. The source electrode SE is arranged on the first insulating layer 110 to overlap the conductive layer pattern 152. The drain electrode DE is arranged on the first insulating layer 110 to overlap the conductive layer pattern 152, and the drain electrode DE is spaced apart from the source electrode SE.

The semiconductor pattern AP is arranged on the source electrode SE and the drain electrode DE, and a second insulating layer 120 is arranged on the semiconductor pattern AP. Also, the gate electrode GE is arranged on the second insulating layer 120 to overlap the semiconductor pattern AP, and a third insulating layer 130 is arranged on the gate electrode GE to cover the TFT TR.

Meanwhile, the conductive layer pattern 152 is arranged on the substrate 100 and is overlapped by the semiconductor pattern AP and serves as a bottom-gate electrode of the TFT TR. Thus, the TFT TR may have a structure of a dual-gate type TFT, wherein the gate electrode GE serves as the top-gate electrode and the conductive layer pattern 152 serves as the bottom-gate electrode.

Since the conductive layer pattern 152 is branched from the common voltage line CL, the conductive layer pattern 152 may receive the first common voltage that is transmitted through the common voltage line CL. Thus, a voltage level of a threshold voltage of the TFT TR may be adjusted by controlling a voltage level of the first common voltage, and the voltage level variation of the threshold voltage of the TFT TR, which is caused by increase of the driving time, may be reduced.

Referring to FIG. 1 again, in the exemplary embodiment described in FIGS. 1 to 3, the conductive layer pattern 151, which serves as the top-gate electrode of the TFT TR, is electrically connected to the storage line SL that transmits the common voltage. The common voltage is used to change the voltage level of the threshold voltage of the TFT TR and also used to form a storage capacitor. Therefore, when the voltage level of the common voltage is adjusted, the voltage level of the common voltage is selected within the above-mentioned range corresponding to an appropriate range for forming the storage capacitor.

However, in the exemplary embodiment described in FIGS. 4 to 6, the conductive layer pattern 152 is insulated from the storage line SL, which transmits the second common voltage, and is branched from the common voltage line CL, which transmits the first common voltage different from the second common voltage. Thus, the first common voltage is used only to change the voltage level of the threshold voltage of the TFT TR. That is, when the voltage level of the first common voltage is adjusted, the voltage level of the common voltage may be adjusted regardless of the appropriate ranges for forming the storage capacitor. Also, in one exemplary embodiment, the voltage level of the common voltage may be substantially equal to that of the gate-off voltage applied to the TFT TR. In the exemplary embodiment wherein the voltage level of the common voltage is substantially equal to that of the gate-off voltage, a line to which the gate-off voltage is applied may be electrically connected to the common voltage line CL that transmits the first common voltage.

The pixel electrode PE is electrically connected to the drain electrode DE through a first contact hole CH1. In one exemplary embodiment, the pixel electrode PE may include substantially a same material as the connection electrode BE. In such an exemplary embodiment, the pixel electrode PE may be substantially simultaneously formed together with the connection electrode BE by patterning a transparent conductive material, exemplary embodiments of which include ITO and IZO, through one photolithography process.

Figure 7:
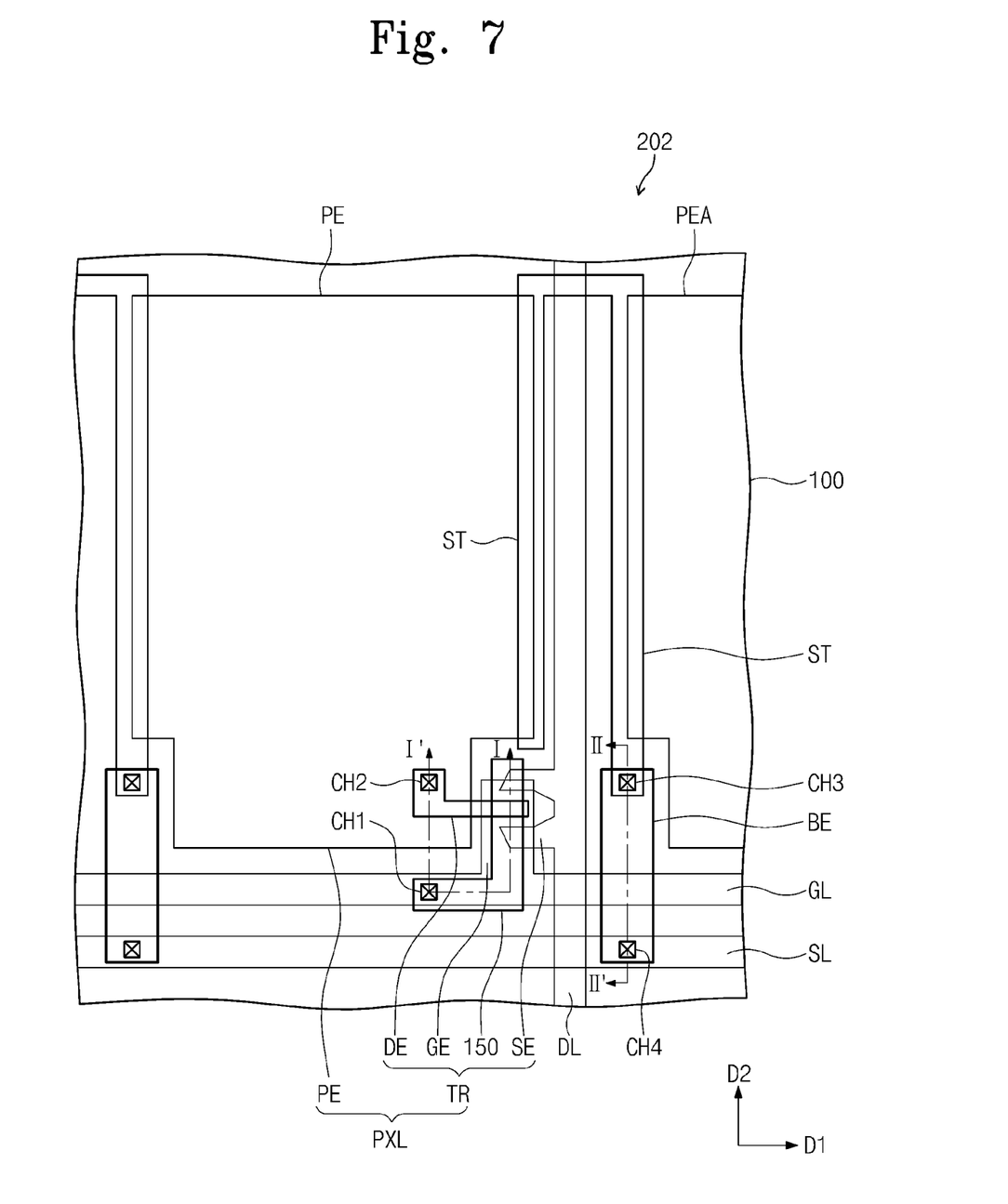
FIG. 7 is a top plan layout view illustrating another exemplary embodiment of a display substrate according to the present invention.
Figure 8:
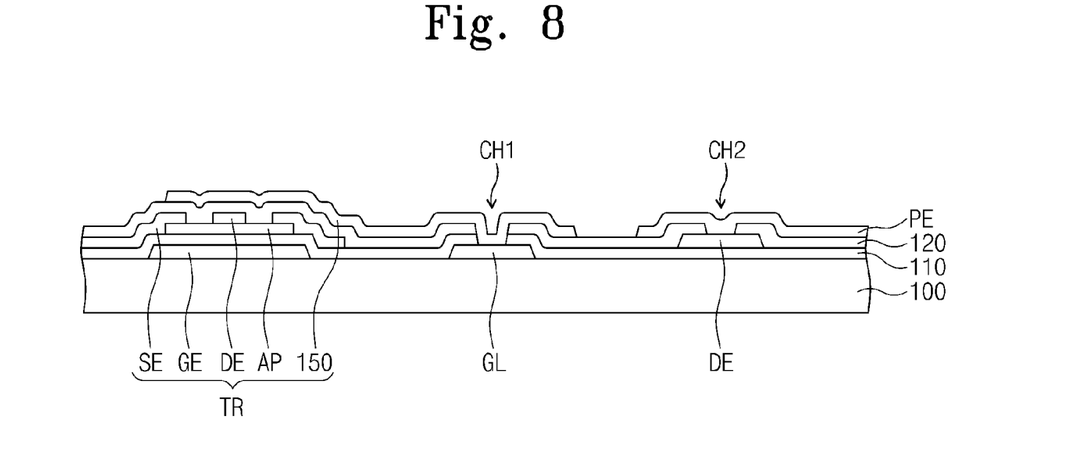
FIG. 8 is a cross-sectional view taken along line I-I' of FIG. 7.
Figure 9:
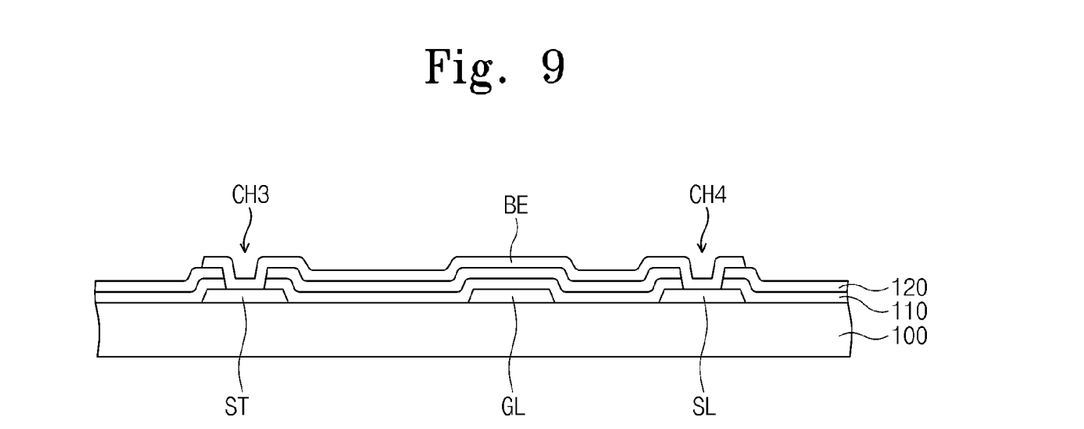
FIG. 9 is a cross-sectional view taken along line II-II' of FIG. 7.

FIG. 7 is a top plan layout view illustrating another exemplary embodiment of a display substrate according to the present invention, FIG. 8 is a cross-sectional view taken along line I-I' of FIG. 7, and FIG. 9 is a cross-sectional view taken along line II-II' of FIG. 7. In FIGS. 7 to 9, the same reference numerals denote the same elements in FIGS. 1 to 3, and thus the detailed descriptions of the same elements will be omitted.

Referring to FIGS. 7 to 9, a display substrate 202 includes a substrate 100, a gate line GL, a data line DL, a storage line SL, a storage electrode ST, a connection electrode BE, and a pixel PXL. The pixel PXL includes a TFT TR and a pixel electrode PE, which is electrically connected to the TFT TR through a second contact hole CH2.

The connection electrode BE electrically connects the storage line SL and the storage electrode ST. The connection electrode BE is electrically connected to the storage electrode ST through a third contact hole CH3 and electrically connected to the storage line SL through a fourth contact hole CH4. In one exemplary embodiment, the connection electrode BE may include substantially the same material as the pixel electrode PE. In such an exemplary embodiment, the connection electrode BE may be substantially simultaneously formed together with the pixel electrode PE by patterning a transparent conductive material, exemplary embodiments of which include ITO and IZO, through one photolithography process.

The TFT TR includes a gate electrode GE, a drain electrode DE, a source electrode SE, a semiconductor pattern AP, and a conductive layer pattern 150. The TFT TR is turned on upon receiving a gate signal from the gate line GL to transmit a data signal to the pixel electrode PE via the data line DL.

Similar to the exemplary embodiment described with respect to FIGS. 1-3, the gate electrode GE is branched from the gate line GL and arranged on the substrate 100. The semiconductor pattern AP is arranged on a first insulating layer 110 and overlaps the gate electrode GE. The drain electrode DE is branched from the data line DL and arranged on the semiconductor pattern AP. In addition, the source electrode SE is spaced apart from the drain electrode DE and arranged on the semiconductor pattern AP. A second insulating layer 120 including an insulating material, exemplary embodiments of which include silicon oxide, is arranged on the source electrode SE and the drain electrode DE.

The conductive layer pattern 150 overlaps the semiconductor pattern AP and is arranged on the second insulating layer 120. The conductive layer pattern 150 is electrically connected to the gate line GL through a first contact hole CH1, thereby serving as a top-gate electrode of the TFT TR. Thus, the TFT TR may have a structure of a dual-gate type TFT in which the gate electrode GE serves as a bottom-gate electrode and the conductive layer pattern 150 serves as the top-gate electrode.

As described above, since the conductive layer pattern 150 and the gate electrode GE are electrically connected to each other, the conductive layer pattern 150 receives a voltage having the same polarity as that applied to the gate electrode GE. In case that the conductive layer pattern 150 serving as the top-gate electrode receives the same polarity as that applied to the gate electrode GE serving as the bottom-gate electrode, an amount of an ON current of the TFT TR may increase at a saturation time of the TFT TR, and the amount of an OFF current may decrease at a time when the TFT TR is turned off.

In one exemplary embodiment, the conductive layer pattern 150 may include substantially the same material as the pixel electrode PE and the connection electrode BE. In such an exemplary embodiment, the pixel electrode PE, the connection electrode BE, and the conductive layer pattern 150 may be substantially simultaneously formed by patterning a transparent conductive material, exemplary embodiments of which include ITO and IZO, through one photolithography process.

According to the display substrate having the TFT, although the threshold voltage of the TFT varies according to the semiconductor material and the TFT operating time, the threshold voltage of the TFT may be easily controlled by adjusting the voltage level of the common voltage applied to the conductive layer pattern or by applying a gate voltage to the conductive layer pattern.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display substrate comprising:
    a substrate;
    a gate electrode arranged on the substrate;
    a semiconductor pattern arranged on the gate electrode;
    a source electrode arranged on the semiconductor pattern;
    a drain electrode arranged on the semiconductor pattern and spaced apart from the source electrode;
    an insulating layer arranged on, and substantially covering, the source electrode and the drain electrode;
    a conductive layer pattern arranged on the insulating layer and aligned with the semiconductor pattern;
    a pixel electrode electrically connected to the drain electrode; and
    a storage electrode arranged on the substrate and overlapping the pixel electrode, the storage electrode being electrically connected to the conductive layer pattern.

2. The display substrate of claim 1, wherein the semiconductor pattern comprises an oxide semiconductor material.

3. The display substrate of claim 2, wherein the insulating layer comprises at least one of a silicon oxide layer and a silicon nitride layer.

4. The display substrate of claim 1, further comprising:
    a gate line arranged on the substrate and electrically connected to the gate electrode;
    a data line arranged on the substrate and insulated from the gate line; and
    a storage line electrically connected to the storage electrode and the conductive layer pattern, and which applies a common voltage to the storage electrode and the conductive layer pattern.

5. The display substrate of claim 4, wherein the conductive layer pattern and the pixel electrode are formed from substantially a same material on substantially a same layer of the display substrate.

6. The display substrate of claim 5, wherein the storage line and the storage electrode are spaced apart from each other, and the conductive layer pattern electrically connects the storage electrode and the storage line.

7. The display substrate of claim 4, wherein a threshold voltage of a thin film transistor, which is defined by the gate electrode, the semiconductor pattern, the source electrode, and the drain electrode, is adjusted according to a voltage level of the common voltage.

8. The display substrate of claim 7, wherein a voltage level of the threshold voltage decreases as the voltage level of the common voltage increases, and the voltage level of the threshold voltage increases as the voltage level of the common voltage decreases.

9. The display substrate of claim 4, wherein the storage electrode overlaps the data line and an adjacent pixel electrode, the data line being interposed between the storage electrode and the adjacent pixel electrode.

10. A display substrate comprising:
    a substrate;
    a conductive layer pattern arranged on the substrate and which receives a first common voltage;
    a first insulating layer arranged on the conductive layer pattern and which substantially covers the conductive layer pattern;
    a source electrode arranged on the first insulating layer and aligned with the conductive layer pattern;
    a drain electrode arranged on the first insulating layer and spaced apart from the source electrode and aligned with the conductive layer pattern;
    a semiconductor pattern arranged on the source electrode and the drain electrode;
    a second insulating layer arranged on the semiconductor pattern;
    a gate electrode arranged on the second insulating layer and aligned with the semiconductor pattern; and a pixel electrode making contact with the drain electrode to be electrically connected to the drain electrode.

11. The display substrate of claim 10, wherein the semiconductor pattern comprises an oxide semiconductor.

12. The display substrate of claim 11, wherein the first insulating layer and the second insulating layer each comprise at least one of a silicon oxide layer and a silicon nitride layer.

13. The display substrate of claim 10, further comprising:
a gate line arranged on the substrate and electrically connected to the gate electrode;
a data line arranged on the substrate and insulated from the gate line;
a common voltage line electrically connected to the conductive layer pattern and which applies the first common voltage to the conductive layer pattern;
a storage electrode overlapping the pixel electrode to form a storage capacitor; and
a storage line electrically connected to the storage electrode, and which applies a second common voltage to the storage electrode.

14. The display substrate of claim 13, wherein the first common voltage is substantially equal to a gate-off voltage of the gate electrode.

15. The display substrate of claim 13, further comprising a connection electrode that includes a substantially same material as the pixel electrode and electrically connects the storage electrode and the storage line,
wherein the storage electrode and the storage line are spaced apart from each other.

16. The display substrate of claim 10, wherein a threshold voltage of a thin film transistor, which is defined by the gate electrode, the source electrode, the drain electrode, and the semiconductor pattern, is adjusted according to a voltage level of the first common voltage.

17. The display substrate of claim 16, wherein a voltage level of the threshold voltage decreases as the voltage level of the first common voltage increases, and the voltage level of the threshold voltage increases as the voltage level of the first common voltage decreases.

18. A display substrate comprising:
a substrate;
a gate electrode arranged on the substrate;
a semiconductor pattern arranged on the gate electrode;
a source electrode arranged on the semiconductor pattern;
a drain electrode arranged on the semiconductor pattern and spaced apart from the source electrode;
an insulating layer arranged on the source electrode and the drain electrode, and which substantially covers the source electrode and the drain electrode; and
a conductive layer pattern arranged on the insulating layer, and overlapping the semiconductor pattern, and electrically connected to the gate electrode.

19. The display substrate of claim 18, wherein the semiconductor pattern comprises an oxide semiconductor.

20. The display substrate of claim 19, wherein the insulating layer comprises at least one of a silicon oxide layer and a silicon nitride layer.

21. The display substrate of claim 18, further comprising:
a gate line arranged on the substrate and electrically connected to the gate electrode and the conductive layer pattern;
a data line arranged on the substrate and insulated from the gate line, the data line being electrically connected to the source electrode;
a pixel electrode electrically connected to the drain electrode;
a storage electrode overlapping the pixel electrode to form a storage capacitor; and
a storage line arranged on the substrate and spaced apart from the gate line, the storage line being electrically connected to the storage electrode,
wherein the conductive layer pattern is electrically connected to the gate electrode through the gate line.

22. The display substrate of claim 21, wherein the conductive layer pattern comprises a substantially same material as the pixel electrode.

23. The display substrate of claim 22, further comprising a connection electrode which includes a substantially same material as the pixel electrode, and wherein the connection electrode electrically connects the storage electrode and the storage line,
wherein the storage line is spaced apart from the storage electrode.

* * * * *